(12) United States Patent
 Ho

(10) Patent No.: US 10,201,099 B1
(45) Date of Patent: Feb. 5, 2019

(54) MANUFACTURING METHOD OF CIRCUIT SUBSTRATE INCLUDING ELECTRONIC DEVICE

(71) Applicant: Chung W. Ho, Taipei (TW)

(72) Inventor: Chung W. Ho, Taipei (TW)

( * ) Notice: Subject to any disclaimer, the term of this patent is extended or adjusted under 35 U.S.C. 154(b) by 0 days.

(21) Appl. No.: 15/886,854

(22) Filed: Feb. 2, 2018

(30) Foreign Application Priority Data

Nov. 14, 2017 (CN) .......................... 2017 1 1122461

(51) Int. Cl.
| H05K 13/00 | (2006.01) |
| H05K 3/46 | (2006.01) |
| H05K 3/06 | (2006.01) |
| H05K 3/40 | (2006.01) |
| H05K 1/11 | (2006.01) |
| H05K 1/18 | (2006.01) |

(Continued)

(52) U.S. Cl.
CPC .............. *H05K 3/4682* (2013.01); *H05K 1/09* (2013.01); *H05K 1/115* (2013.01); *H05K 1/188* (2013.01); *H05K 3/0097* (2013.01); *H05K 3/06* (2013.01); *H05K 3/282* (2013.01); *H05K 3/284* (2013.01); *H05K 3/32* (2013.01); *H05K 3/4007* (2013.01); *H05K 3/4038* (2013.01); *H05K 3/4652* (2013.01); *H05K 3/4697* (2013.01); *H05K 1/0224* (2013.01); *H05K 2201/0338* (2013.01); *H05K 2201/09509* (2013.01); *H05K 2203/0152* (2013.01); *H05K 2203/0228* (2013.01); *H05K 2203/041* (2013.01); *H05K 2203/1316* (2013.01)

(58) Field of Classification Search
CPC ........ H05K 3/4682; H05K 1/09; H05K 1/115; H05K 1/188; H05K 3/0097; H05K 3/06; H05K 3/282; H05K 3/284; H05K 3/32; H05K 3/4007; H05K 3/4038; H05K 3/4652; H05K 3/4697
See application file for complete search history.

(56) References Cited

U.S. PATENT DOCUMENTS

| 5,048,179 A | 9/1991 | Shindo et al. |
| 6,332,766 B1 * | 12/2001 | Thummel ......... B29C 45/14655 257/E21.504 |

(Continued)

FOREIGN PATENT DOCUMENTS

| CN | 102573335 | 8/2016 |
| TW | I237885 | 8/2005 |

*Primary Examiner* — Paul D Kim
(74) *Attorney, Agent, or Firm* — JCIPRNET

(57) ABSTRACT

A circuit board including an electronic device and a manufacturing method of the circuit board are provided. The manufacturing method includes: providing a stainless steel base material including a first surface and a second surface opposite to each other, at least one first cavity located at the first surface and at least one second cavity located at the second surface; respectively forming a first and a second metal layers on the stainless steel base material; respectively disposing at least one first and at least one second electronic devices in the first and the second cavities; respectively forming a first and a second insulating layers on the first and the second surfaces; respectively forming a first and a second circuit structures on the first and the second insulating layers, separating the stainless steel base material, the first and the second metal layers to form two separate circuit substrates including electronic devices.

18 Claims, 16 Drawing Sheets

(51) Int. Cl.
    *H05K 3/28*     (2006.01)
    *H05K 3/00*     (2006.01)
    *H05K 1/09*     (2006.01)
    *H05K 3/32*     (2006.01)
    *H05K 1/02*     (2006.01)

(56) References Cited

U.S. PATENT DOCUMENTS

| | | | |
|---|---|---|---|
| 7,223,687 B1* | 5/2007 | Ho | H05K 3/0058 29/829 |
| 8,959,760 B2* | 2/2015 | Niki | H05K 3/4682 174/255 |
| 9,137,899 B2* | 9/2015 | Ho | H05K 1/185 |
| 9,215,812 B2* | 12/2015 | Kobayashi | H01L 21/4857 |
| 9,433,106 B2* | 8/2016 | Ishida | H05K 3/4038 |
| 9,763,332 B2* | 9/2017 | Kobayashi | H01L 21/4857 |
| 2004/0074088 A1* | 4/2004 | Nakamura | H01L 21/4857 29/831 |
| 2005/0155222 A1* | 7/2005 | Nakamura | H05K 3/0058 29/830 |

* cited by examiner

MANUFACTURING METHOD OF CIRCUIT SUBSTRATE INCLUDING ELECTRONIC DEVICE

CROSS-REFERENCE TO RELATED APPLICATION

This application claims the priority benefit of China application serial no. 201711122461.6, filed on Nov. 14, 2017. The entirety of the above-mentioned patent application is hereby incorporated by reference herein and made a part of this specification.

BACKGROUND OF THE INVENTION

1. Field of the Invention

The invention relates to a circuit substrate including an electronic device and a manufacturing method of the circuit substrate, and particularly relates to a circuit substrate including an electronic device and having a reusable core base material and a manufacturing method of the circuit substrate.

2. Description of Related Art

In general, a circuit substrate including an embedded electronic device is formed by firstly embedding the electronic device into a cavity of a core substrate, and then forming built-up circuit layers on two surfaces of the substrate to be electrically connected with the electronic device in the cavity. In the circuit substrate with the embedded electronic device formed accordingly, the core substrate becomes a portion of the final product, so the core substrate is not reusable, and the final product is also thicker. In addition, such circuit substrate requires more materials and a longer manufacturing process. The manufacturing cost is thus higher.

SUMMARY OF THE INVENTION

One or some exemplary embodiments of the invention provide a manufacturing method of a circuit board including an electronic device. A core base material of the circuit board has a higher structural stability and is reusable.

One or some exemplary embodiments of the invention also provide a circuit board including an electronic device manufactured according to the manufacturing method of the circuit board including an electronic device.

According to an embodiment of the invention, a manufacturing method of a circuit substrate including an electronic device including the following: providing a stainless steel base material, wherein the stainless steel base material has a first surface and a second surface opposite to each other, at least one first cavity located at the first surface, and at least one second cavity located at the second surface; respectively forming a first metal layer and a second metal layer on the stainless steel base material, wherein the first metal layer is disposed on the first surface and covers inner walls of the first cavity, and the second metal layer is disposed on the second surface and covers inner walls of the second cavity; respectively disposing at least one first electronic device and at least one second electronic device in the first cavity and the second cavity, wherein the first metal layer is located between the first electronic device and the stainless steel base material, and the second metal layer is located between the second electronic device and the stainless steel base material; respectively forming a first insulating layer and a second insulating layer on the first stainless steel stacking layer and the second stainless steel stacking layer, wherein the first insulating layer covers the first electronic device and the first metal layer, and the second insulating layer covers the second electronic device and the second metal layer; respectively forming a first circuit structure and a second circuit structure on the first insulating layer and the second insulating layer, wherein the first circuit structure penetrates the first insulating layer and is electrically connected with the at least one first electronic device, and the second circuit structure penetrates the second insulating layer and is electrically connected with the at least one second electronic device; and separating the stainless steel base material, the first metal layer, and the second metal layer to form two separate circuit substrates.

In the manufacturing method according to an embodiment of the invention, the stainless steel base material includes a stainless steel core layer, a first stainless steel stacking layer, and a second stainless steel stacking layer. The stainless steel core layer is located between the first stainless steel stacking layer and the second stainless steel stacking layer. The first cavity penetrates the first stainless steel stacking layer and exposes a portion of the first surface of the stainless steel core layer. The second cavity penetrates the second stainless steel stacking layer and exposes a portion of the second surface of the stainless steel core layer.

In the manufacturing method according to an embodiment of the invention, the first stainless steel stacking layer includes a first stainless steel layer and a first adhesive layer, and the second stainless steel stacking layer includes a second stainless steel layer and a second adhesive layer. The first adhesive layer is located between the first stainless steel layer and the stainless steel core layer, and the second adhesive layer is located between the second stainless steel layer and the stainless steel core layer. Providing the stainless steel base material includes performing a drilling process through the first stainless steel layer and the first adhesive layer and through the second stainless steel layer and the second adhesive layer. After the drilling process, the first stainless steel layer and the first adhesive layer are pressed onto the first surface of the stainless steel core layer to form the first cavity and the second stainless steel layer and the second adhesive layer are pressed to form the second cavity on the second surface of the stainless steel core layer.

In the manufacturing method according to an embodiment of the invention, materials of the first adhesive layer and the second adhesive layer include a resin or acrylate.

In the manufacturing method according to an embodiment of the invention, the stainless steel base material includes a device disposing region and a circuit disposing region located on a periphery of the device disposing region. The first metal layer and the second metal layer completely cover the device disposing region and the circuit disposing region.

In the manufacturing method according to an embodiment of the invention, the stainless steel base material further includes at least one third cavity and at least one fourth cavity. The third cavity penetrates the first stainless steel stacking layer and exposes a portion of the first surface of the stainless steel core layer, and the fourth cavity penetrates the second stainless steel stacking layer and exposes a portion of the second surface of the stainless steel core layer. The first cavity and the second cavity are located in the device disposing region, and the at least one third cavity and the at least one fourth cavity are located in the circuit disposing region.

In the manufacturing method according to an embodiment of the invention, when the first metal layer and the second metal layer are respectively formed on the stainless steel base material, the first metal layer further covers inner walls of the third cavity, and the second metal layer further covers inner walls of the fourth cavity.

In the manufacturing method according to an embodiment of the invention, the manufacturing method further includes respectively forming at least one first bump and at least one second bump in the third cavity and the fourth cavity. The first metal layer is located between the first bump and the stainless steel base material, and the second metal layer is located between the second bump and the stainless steel base material.

In the manufacturing method according to an embodiment of the invention, materials of the first metal layer and the second metal layer respectively include copper, and the manufacturing method further includes: respectively forming a first nickel layer and a second nickel layer on the first metal layer and the second metal layer after respectively forming the first metal layer and the second metal layer on the stainless steel base material; and respectively forming a first circuit pattern and a second circuit pattern on the first nickel layer and the second nickel layer, wherein the first circuit pattern covers the first nickel layer, and the second circuit pattern covers the second nickel layer.

In the manufacturing method according to an embodiment of the invention, after separating the stainless steel base material, the first metal layer, and the second metal layer, the method further includes removing the first metal layer, the first nickel layer, the second metal layer, and the second nickel layer by etching to expose the first circuit pattern and the second circuit pattern.

In the manufacturing method according to an embodiment of the invention, materials of the first metal layer and the second metal layer respectively include nickel, and the manufacturing method further includes: respectively forming a first circuit pattern and a second circuit pattern on the first metal layer and the second metal layer, wherein the first circuit pattern covers the first metal layer, and the second circuit pattern covers the second metal layer.

In the manufacturing method according to an embodiment of the invention, after separating the stainless steel base material, the first metal layer, and the second metal layer, the method further includes removing the first metal layer and the second metal layer by etching to expose the first circuit pattern and the second circuit pattern.

In the manufacturing method according to an embodiment of the invention, a depth of the first cavity is greater than a height of the first electronic device, and a depth of the second cavity is greater than a height of the second electronic device.

In the manufacturing method according to an embodiment of the invention, the first circuit structure includes a first patterned circuit layer and at least one first conductive blind hole, and the second circuit structure includes a second patterned circuit layer and at least one second conductive blind hole. The first conductive blind hole is located between the first electronic device and the first patterned circuit layer, the second conductive blind hole is located between the at least one second electronic device and the second patterned circuit layer. The first patterned circuit layer and the second patterned circuit layer are respectively located on the first insulating layer and the second insulating layer.

In the manufacturing method according to an embodiment of the invention, after respectively forming the first circuit structure and the second circuit structure on the first insulating layer and the second insulating layer, and before separating the stainless steel base material, the first metal layer, and the second metal layer, the method further includes respectively forming a first patterned solder mask and a second patterned solder mask on the first insulating layer and the second insulating layer. The first patterned solder mask and the second patterned solder mask respectively cover the first insulating layer and the second insulating layer and respectively expose a portion of the first circuit structure and a portion of the second circuit structure.

In the manufacturing method according to an embodiment of the invention, after separating the stainless steel base material, the first metal layer, and the second metal layer, the method further includes forming a molding compound to at least encapsulate the first electronic device and the second electronic device.

In the manufacturing method according to an embodiment of the invention, the first circuit structure includes at least one first insulating layer, a first solder resistant layer, at least one first patterned circuit layer, and at least one first conductive blind hole, the second circuit structure includes at least one second insulating layer, a second solder resistant layer, at least one second patterned circuit layer, and at least one second conductive blind hole. The at least one first insulating layer and the first solder resistant layer cover the first patterned circuit layer, and the at least one second insulating layer and the second solder resistant layer cover the at least one second patterned circuit layer. The at least one first conductive blind hole and the at least one second conductive blind hole respectively penetrate the first insulating layer and the second insulating layer.

In the manufacturing method according to an embodiment of the invention, a material of the stainless steel base material is selected from SUS 304, SUS 430, SUS 630, an iron-nickel alloy, and a Kovar alloy.

In the manufacturing method according to an embodiment of the invention, the first cavity and the second cavity of the stainless steel base material are formed by removing a portion of the stainless steel base material by electrical discharging machining or mechanical processing.

An embodiment of the invention provides a circuit substrate including an electronic device. The circuit substrate includes an insulating layer, at least one electronic device, a circuit pattern layer, and a circuit structure. The insulating layer has an upper surface and a lower surface opposite to each other. The electronic device is disposed on the upper surface of the insulating layer. The one circuit pattern layer is disposed on the upper surface of the insulating layer. The circuit structure is disposed on the lower surface of the insulating layer and includes at least one patterned circuit layer and at least one conductive blind hole. The conductive blind hole penetrates the insulating layer to be electrically connected with the electronic device.

In the circuit substrate according to an embodiment of the invention, the circuit substrate further includes a patterned solder mask disposed on the lower surface of the insulating layer and exposing the patterned circuit layer.

In the circuit substrate according to an embodiment of the invention, the circuit structure further includes at least one insulating layer and a solder resistant layer. The insulating layer and the solder resistant layer cover the patterned circuit layer, and the conductive blind hole penetrates the insulating layer.

In the circuit substrate according to an embodiment of the invention, the one circuit pattern layer covers a portion of the upper surface of the insulating layer and extends to cover the electronic device.

In the circuit substrate according to an embodiment of the invention, the circuit substrate further includes a molding compound disposed on the upper surface of the insulating layer and encapsulating the electronic device.

In the circuit substrate according to an embodiment of the invention, the circuit substrate further includes at least one bump disposed on the circuit pattern layer and electrically connected with the circuit pattern layer.

In the circuit substrate according to an embodiment of the invention, the circuit substrate further includes at least one solder ball disposed on the patterned circuit layer.

In the circuit substrate according to an embodiment of the invention, the electronic device includes an active device and a passive device.

Based on the above, in the manufacturing method of the circuit substrate including an electronic device according to the embodiments of the invention, the electronic devices are disposed in the cavities of the stainless steel base material including the stainless steel core layer and the first stainless steel stacking layer and the second stainless steel stacking layer located at opposite two sides of the stainless steel core layer. Accordingly, the stainless steel base material provides a higher structural stability and interlayer alignment precision for build-up layers. Besides, after the circuit structures are formed to be electrically connected to the electronic devices, the stainless steel base material is separated, and two separate circuit substrates including electronic devices are formed. Under the circumstance, the circuit substrates including electronic devices are coreless circuit substrates including electronic devices. Since the stainless steel base material is reusable, the manufacturing cost may be reduced. In brief, in the manufacturing method of the circuit substrate including an electronic device according to the embodiments of the invention, two circuit substrates including electronic devices are able to be manufactured at the same time. Therefore, the manufacturing volume is up and the manufacturing cost is down.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
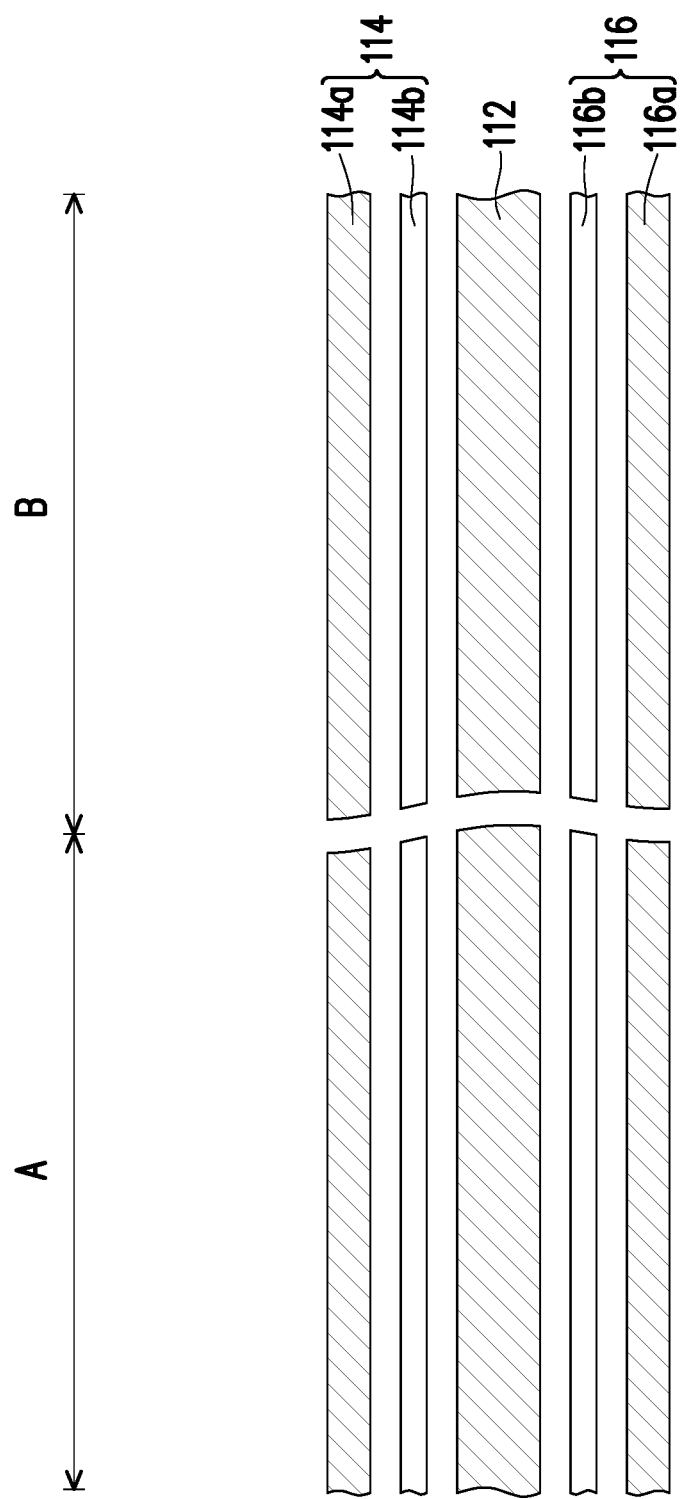
FIGS. 1A to 1L are schematic cross-sectional views illustrating a manufacturing method of a circuit board including an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
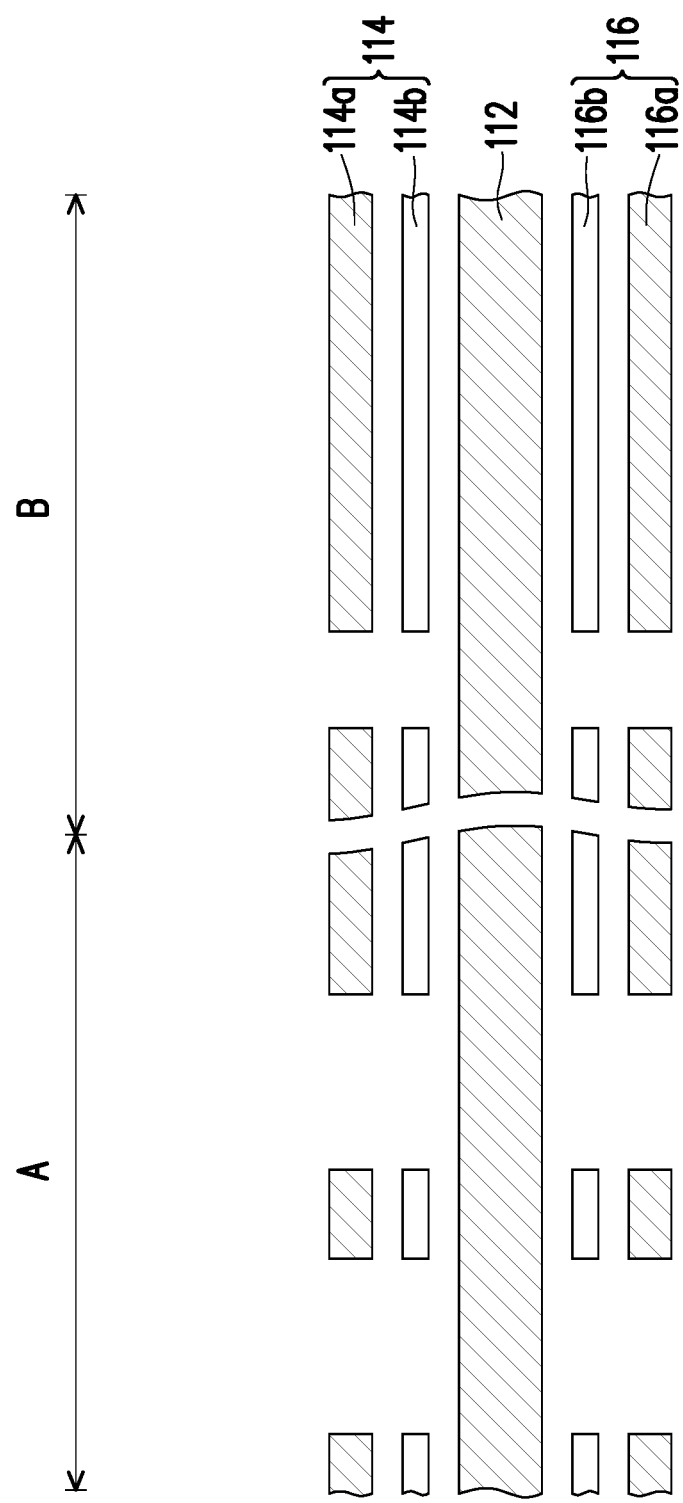
Figure 1C:
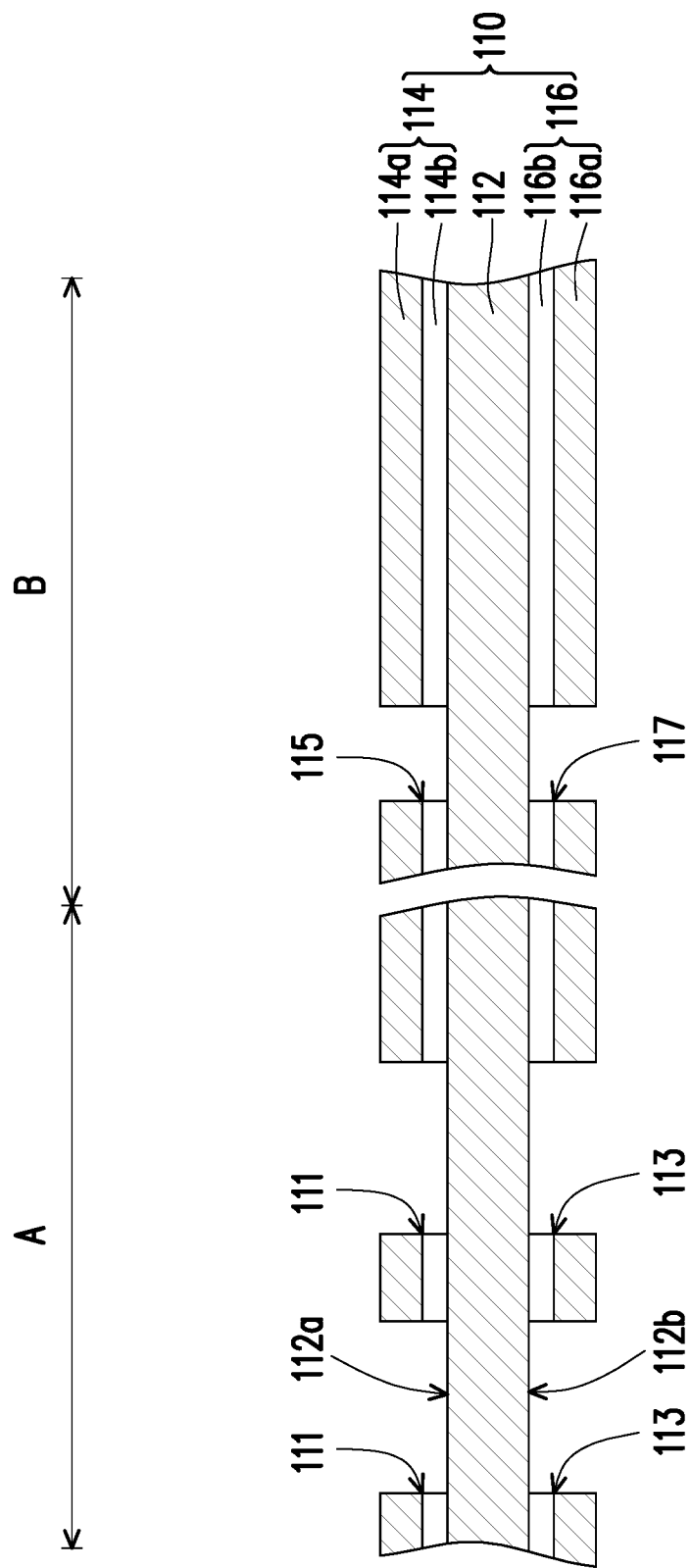

FIGS. 1A to 1L are schematic cross-sectional views illustrating a manufacturing method of a circuit board including an electronic device according to an embodiment of the invention. Referring to FIG. 1C, in the embodiment, a stainless steel base material 110 is firstly provided. Specifically, referring to FIG. 1A, a stainless steel core layer 112, a first stainless steel stacking layer 114, and a second stainless steel stacking layer 116 are provided. The first stainless steel stacking layer 114 and the second stainless steel stacking layer 116 are respectively located at opposite sides of the stainless steel core layer 112. The first stainless steel stacking layer 114 includes a first stainless steel layer 114a and a first adhesive layer 114b, and the second stainless steel stacking layer 116 includes a second stainless steel layer 116a and a second adhesive layer 116b. The first adhesive layer 114b is located between the first stainless steel layer 114a and the stainless steel core layer 112, and the second adhesive layer 116b is located between the second stainless steel layer 116a and the stainless steel core layer 112. In the embodiment, thicknesses of the first stainless steel layer 114a and the second stainless steel layer 116a are respectively in a range from 0.02 millimeters to 0.1 millimeters, for example, and a thickness of the stainless steel core layer 112 is in a range from 0.05 millimeters to 0.2 millimeters, for example. Thicknesses of the first adhesive layer 114b and the second adhesive layer 116b are respectively in a range from 0.015 millimeters to 0.1 millimeters, for example. In the embodiment, a material of the stainless steel base material 110 is selected from SUS 304, SUS 430, SUS 630, an iron-nickel alloy, and a Kovar alloy, and materials of the first adhesive layer 114b and the second adhesive layer 116b include a glass fiber resin, acrylate, or other suitable adhesive materials, for example.

Then, referring to FIG. 1B, a drilling process is performed to penetrate the first stainless steel layer 114a and the first adhesive layer 114b and penetrate the second stainless steel layer 116a and the second adhesive layer 116b. In the embodiment, the drilling process includes performing a punching process or a laser drilling process, for example. However, the invention is not limited thereto.

Then, referring to FIG. 1C, after the drilling process is performed, the first stainless steel layer 114a and the first adhesive layer 114b are pressed to a first surface 112a of the stainless steel core layer 112 to form at least one first cavity 111 (two first cavities 111 shown in FIG. 1C only for an illustrative purpose) and at least one third cavity 115 (one third cavity 115 shown in FIG. 1C only for an illustrative purpose). The second stainless steel layer 116a and the second adhesive layer 116b are pressed to a second surface 112b of the stainless steel core layer 112 to form at least one second cavity 113 (two second cavities 113 shown in FIG. 1C only for an illustrative purpose) and at least one fourth cavity 117 (one fourth cavity 117 shown in FIG. 1C only for an illustrative purpose). Accordingly, manufacture of the stainless steel base material 110 is completed.

More specifically, as shown in FIG. 1C, the stainless steel base material 110 of the embodiment includes the stainless steel core layer 112, the first stainless steel stacking layer 114, the second stainless steel stacking layer 116, the first cavities 111 and the second cavities 113. The stainless steel core layer 112 is located between the first stainless steel stacking layer 114 and the second stainless steel stacking layer 116 and has the first surface 112a and the second surface 112b opposite to each other. The first cavities 111 and the third cavity 115 penetrate the first stainless steel stacking layer 114 and expose a portion of the first surface 112a of the stainless steel core layer 112, and the second cavities 113 and the fourth cavity 117 penetrate the second stainless steel stacking layer 116 and expose a portion of the second surface 112b of the stainless steel core layer 112. In the embodiment, the stainless steel base material 110 has a device disposing region A and a circuit disposing region B located on a periphery of the device disposing region A. In addition, the first cavities 111 and the second cavities 113 are located at the device disposing region A, and the third cavity 115 and the fourth cavity 117 are disposed at the circuit disposing region B.

Figure 1D:
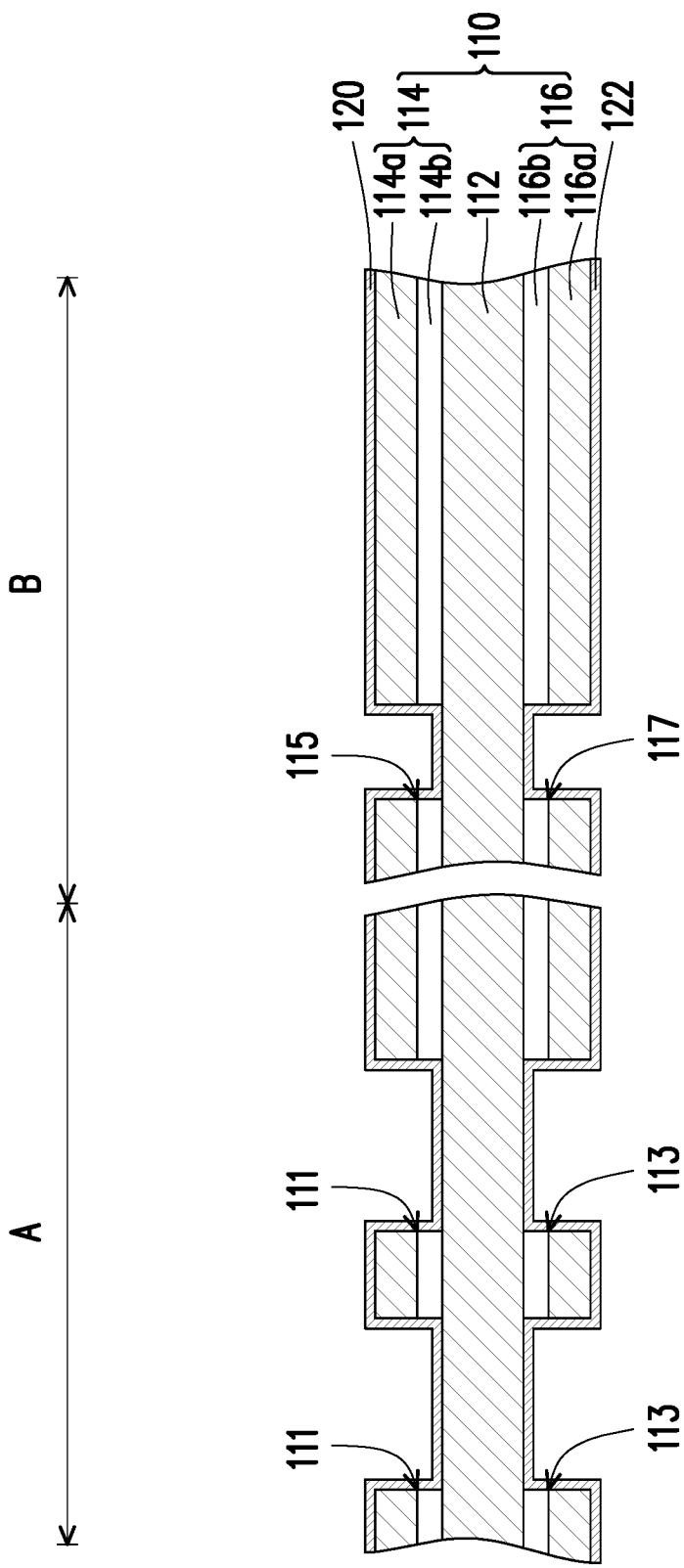

Then, referring to FIG. 1D, a first metal layer 120 and a second metal layer 122 are respectively formed on the stainless steel base material 110. The first metal layer 120 is disposed on the first stainless steel stacking layer 114 and covers inner walls of the first cavities 111 and inner walls of the third cavity 115. The second metal layer 122 is disposed on the second stainless steel stacking layer 116 and covers inner walls of the second cavities 113 and inner walls of the fourth cavity 117. In the embodiment, the first metal layer 120 and the second metal layer 122 completely cover the device disposing region A and the circuit disposing region B. In the embodiment, thicknesses of the first metal layer 120 and the second metal layer 122 are respectively in a range from 4 micrometers to 20 micrometers, for example.

Figure 1E:
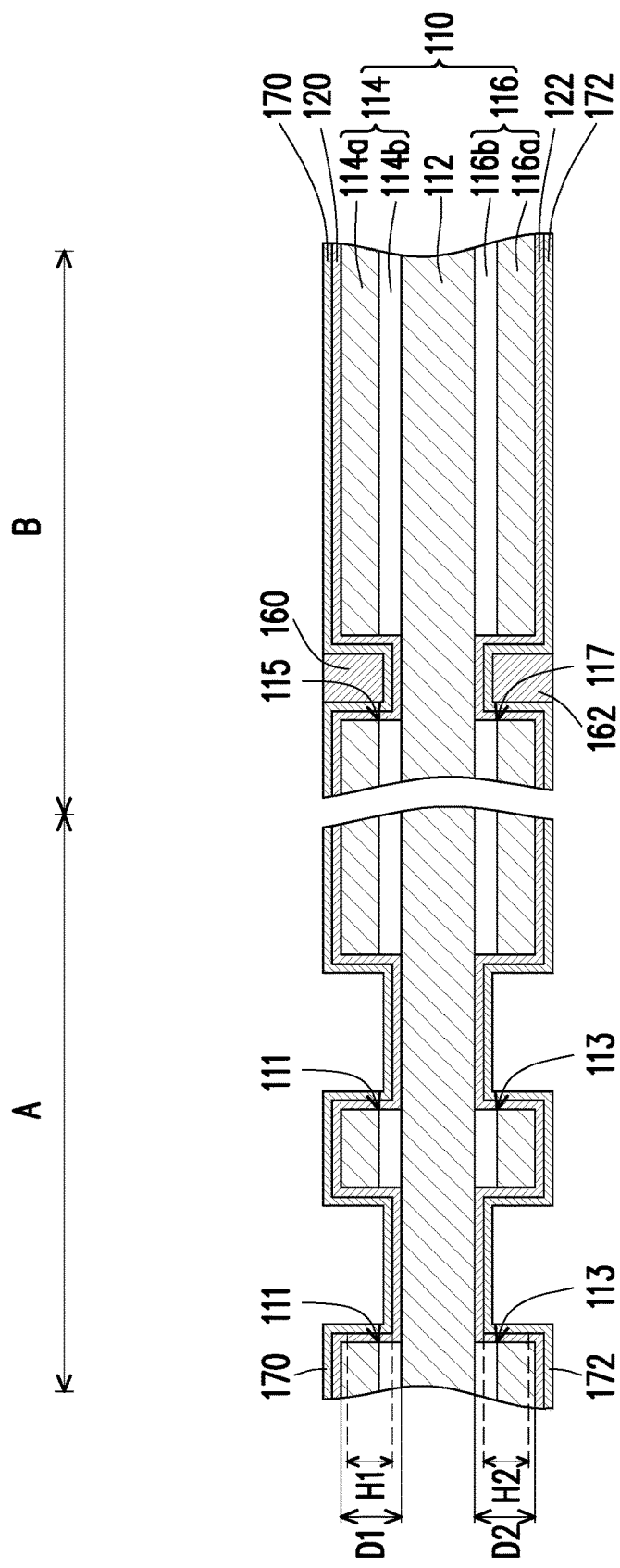

Then, referring to FIG. 1E, after the first metal layer 120 and the second metal layer 122 are respectively formed on the stainless steel base material 110, a first nickel layer 170 and a second nickel layer 172 are respectively formed on the first metal layer 120 and the second metal layer 122. Thicknesses of the first nickel layer 170 and the second nickel layer 172 are respectively two micrometers, for example. Then, at least one first bump 160 (one first bump 160 shown in FIG. 1E only for an illustrative purpose) and at least one second bump 162 (one second bump 162 shown in FIG. 1E only for an illustrative purpose) are respectively formed in the third cavity 115 and the fourth cavity 117. The first metal layer 120 is located between the first bump 160 and the stainless steel base material 110, and the second metal layer 122 is located between the second bump 162 and the stainless steel base material 110. When forming the first bump 160 and the second bump 162, selective via-filling copper plating is performed to only fill the third cavity 115 and the fourth cavity 117. In addition, the first bump 160 and the second bump 162 may be respectively aligned to surfaces of the first nickel layer 170 and the second nickel layer 172.

Figure 1F:
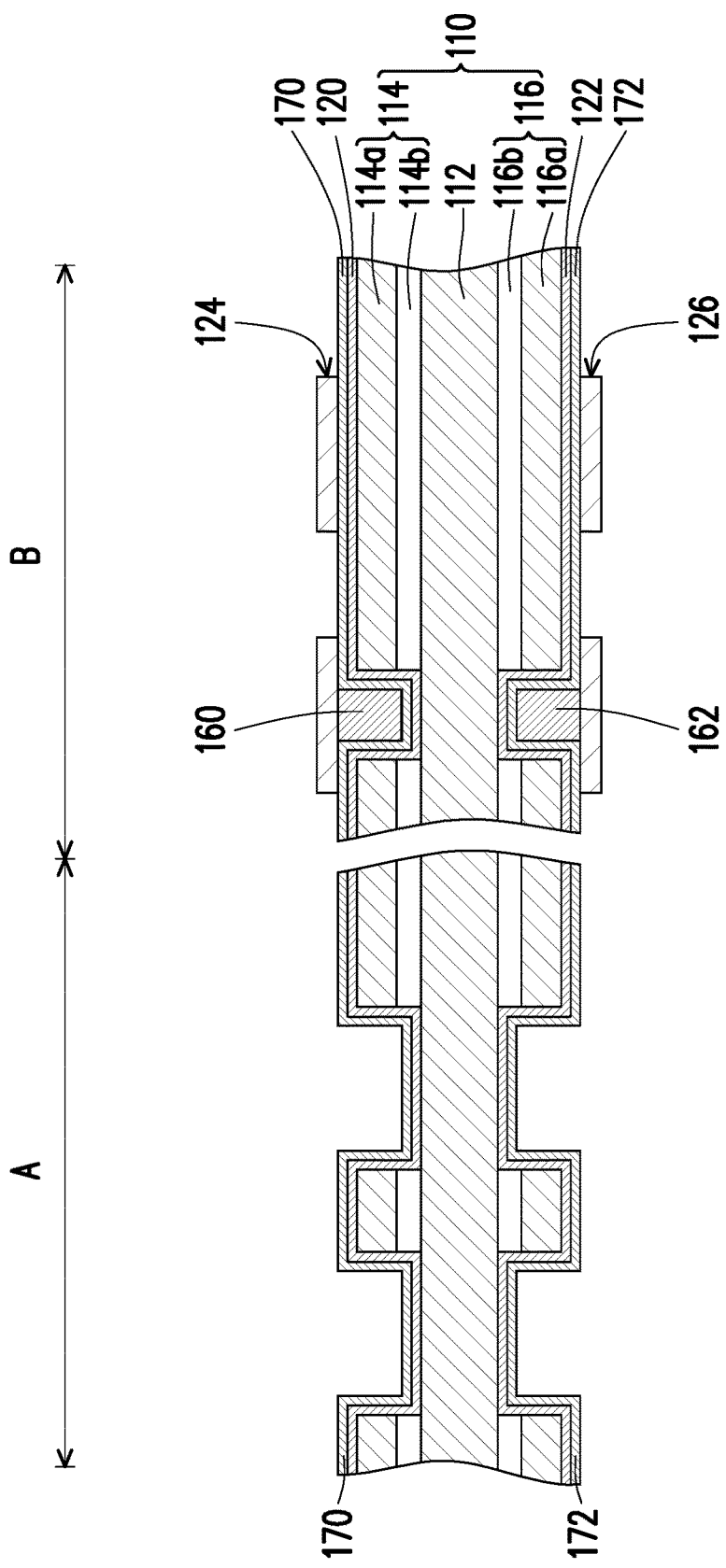

Then, referring to FIG. 1F, a first circuit pattern 124 and a second circuit pattern 126 are respectively formed on the first nickel layer 170 and the second nickel layer 172. The first circuit pattern 124 covers the first nickel layer 170 on the circuit disposing region B, and the second circuit pattern 126 covers the second nickel layer 172 on the circuit disposing region B. In the embodiment, the first circuit pattern 124 may cover the first bump 160 or the first nickel layer 170 excluding the first bump 160 in the circuit disposing region B, and the second circuit pattern 126 may cover the second bump 162 or the second nickel layer 172 excluding the second bump 162 in the circuit disposing region B. In the embodiment, the first circuit pattern 124 and the second circuit pattern 126 may be provided for electrical connection with a power pad or a grounding pad.

Figure 1G:
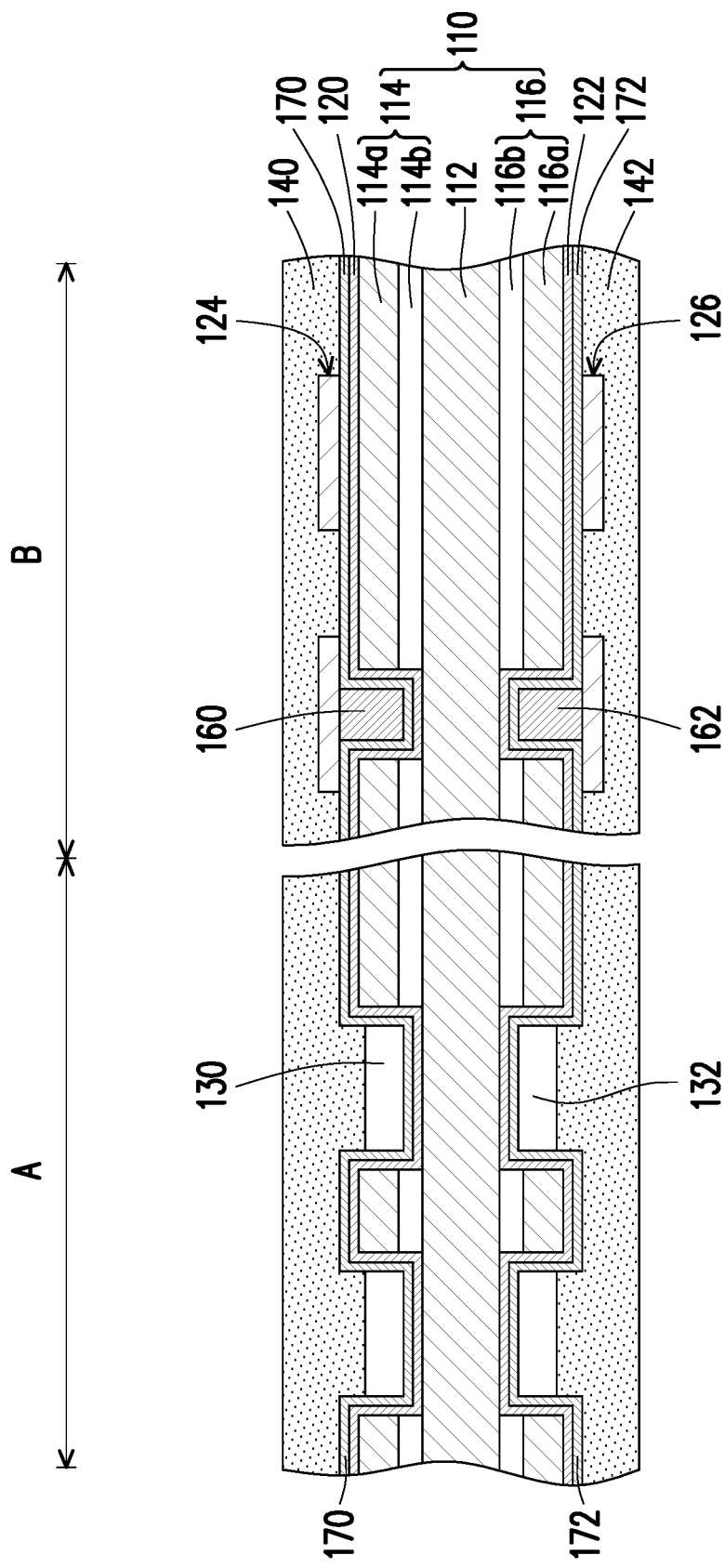
Figure 1H:
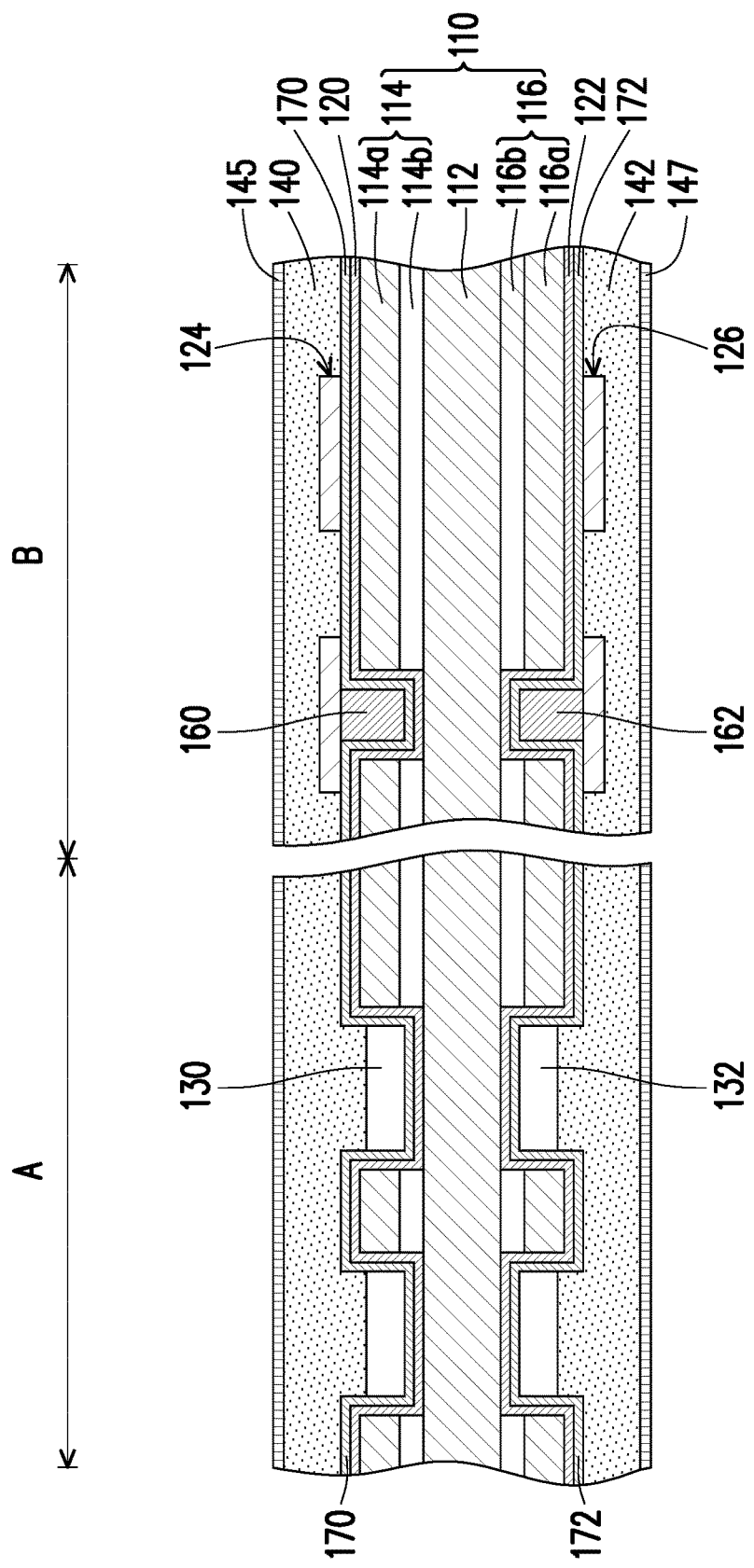

Then, referring to FIG. 1G, at least one first electronic device 130 (two first electronic devices 130 shown in FIG. 1G only for an illustrative purpose) and at least one second electronic device 132 (two second electronic devices 132 shown in FIG. 1G only for an illustrative purpose) are respectively disposed in the first cavities 111 and the second cavities 113. In addition, active surfaces of the first electronic devices 130 and the second electronic devices 132 are respectively oriented away from the stainless steel core layer 112. The electronic devices include active devices and passive devices. The active devices include semiconductor chips, for example, and the passive devices include chip capacitors, resistors, and/or the like, for example. The first metal layer 120 and the first nickel layer 170 are located between the first electronic devices 130 and the stainless steel base material 110, and the second metal layer 122 and the second nickel layer 172 are located between the second electronic devices 132 and the stainless steel base material 110. In the embodiment, the first electronic devices 130 and the second electronic devices 132 are fixed by respectively fixing the first electronic devices 130 and the second electronic devices 132 into the first cavities 111 and the second cavities 113 by die bonding (not shown), for example. Alternatively, during the drilling process, the first stainless steel stacking layer 114 and the second stainless steel stacking layer 116 may be cut by electrical discharging machining. Accordingly, sizes of the first cavities 111 and the second cavities 113 formed subsequently are slightly greater than sizes of the first electronic devices 130 and the second electronic devices 132, and the first electronic devices 130 and the second electronic devices 132 may be fit into the first cavities 111 and the second cavities 113 and fixed. As shown in FIG. 1E, a depth D1 of the first cavities 111 of the embodiment is greater than a height H of the first electronic devices 130, and a depth D2 of the second cavities 113 is greater than a height H2 of the second electronic devices. Herein, the depths D1 and D2 are greater than the heights H1 and H2 by a range from 1 micrometer to 10 micrometers.

Then, referring to FIG. 1G, the first insulating layer 140 and the second insulating layer 142 are respectively formed on the first stainless steel stacking layer 114 and the second stainless steel stacking layer 116. The first insulating layer 140 covers the first electronic devices 130 and the first metal layer 120, and the second insulating layer 142 covers the second electronic devices 132 and the second metal layer 122. More specifically, the first insulating layer 140 further covers the first circuit pattern 124 and the first nickel layer 170 in the circuit disposing region B, and the second insulating layer 142 further covers the second circuit pattern 126 and the first nickel layer 172 in the circuit disposing region B. In the embodiment, materials of the first insulating layer 140 and the second insulating layer 142 include a glass fiber epoxy resin, an ABF resin, polyimide, or other suitable insulating materials.

Figure 1I:
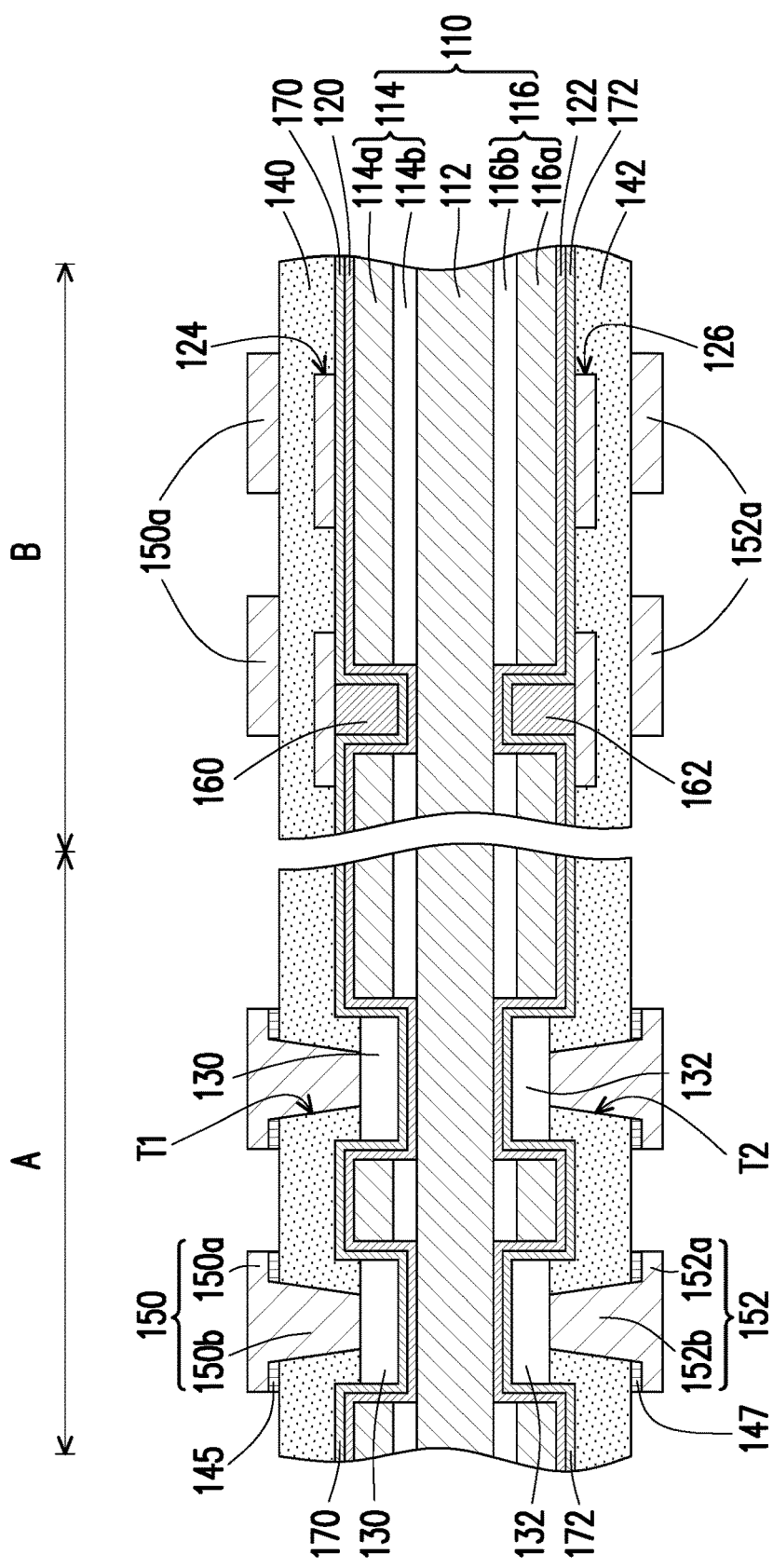

Referring to FIG. 1I, a first circuit structure 150 and a second circuit structure 152 are respectively formed on the first insulating layer 140 and the second insulating layer 142. The first circuit structure 150 penetrates the first insulating layer 140 and is electrically connected with the first electronic devices 130, and the second circuit structure 152 penetrates the second insulating layer 142 and is electrically connected with the second electronic devices 132. Specifically, referring to FIG. 1H, a first copper foil layer 145 and a second copper foil layer 147 are respectively pressed to the first insulating layer 140 and the second insulating layer 142. The first copper foil layer 145 and the second copper foil layer 147 respectively fully cover the first insulating layer 140 and the second insulating layer 142. Then, referring to FIG. 1I, at least one first blind hole T1 (two first blind holes T1 shown in FIG. 1I only for an illustrative purpose) penetrating the first copper foil layer 145 and the first insulating layer 140 and exposing the first electronic device 130 is formed, and at least one second blind hole T2 (two second blind holes T2 shown in FIG. 1I only for an illustrative purpose) penetrating the second copper foil layer 147 and the second insulating layer 142 and exposing the second electronic device 132 is formed. Then, using the first copper foil layer 145 and the second copper foil layer 147 as plating seed layers, metal layers (e.g., copper layers) are formed in the first blind holes T1 and the second blind holes T2 and on the first copper foil layer 145 and the second copper foil layer 147 through plating. Then, the first copper foil layer 145 and the second copper foil layer 147 are patterned to form a first patterned circuit layer 150a exposing a portion of the first insulating layer 140, a second patterned circuit layer 152a exposing a portion of the second insulating layer 142, at least one first conductive blind hole 150b (two first conductive blind holes 150b shown in FIG. 1I only for an illustrative purpose) located in the first blind hole T1 and at least one second conductive blind hole 152b (two second conductive blind holes 152b shown in FIG. 1I only for an illustrative purpose) located in the second blind hole T2. Accordingly, manufacture of the first circuit structure 150 and the second circuit structure 152 is completed.

In brief, the first circuit structure 150 of the embodiment includes the first patterned circuit layer 150a and the first conductive blind holes 150b, and the second circuit structure 152 includes the second patterned circuit layer 152a and the second conductive blind holes 152b. The first conductive blind holes 150b are located between the first electronic devices 130 and the first patterned circuit layer 150a, and the second conductive blind holes 152b are located between the second electronic devices 132 and the second patterned circuit layer 152a. The first patterned circuit layer 150a and the second patterned circuit layer 152a are respectively located on the first insulating layer 140 and the second insulating layer 142. It should be noted that the first circuit structure 150 and the second circuit structure 152 are respectively described as including single layers of the patterned circuit layer (i.e., the first patterned circuit layer 150a and the second patterned circuit layer 152a) as an example. In other embodiments not shown herein, the first circuit structure 150 and the second circuit structure 152 may also respectively include two or more layers of patterned circuit layers. The invention does not intend to impose a limitation on this regard.

Figure 1J:
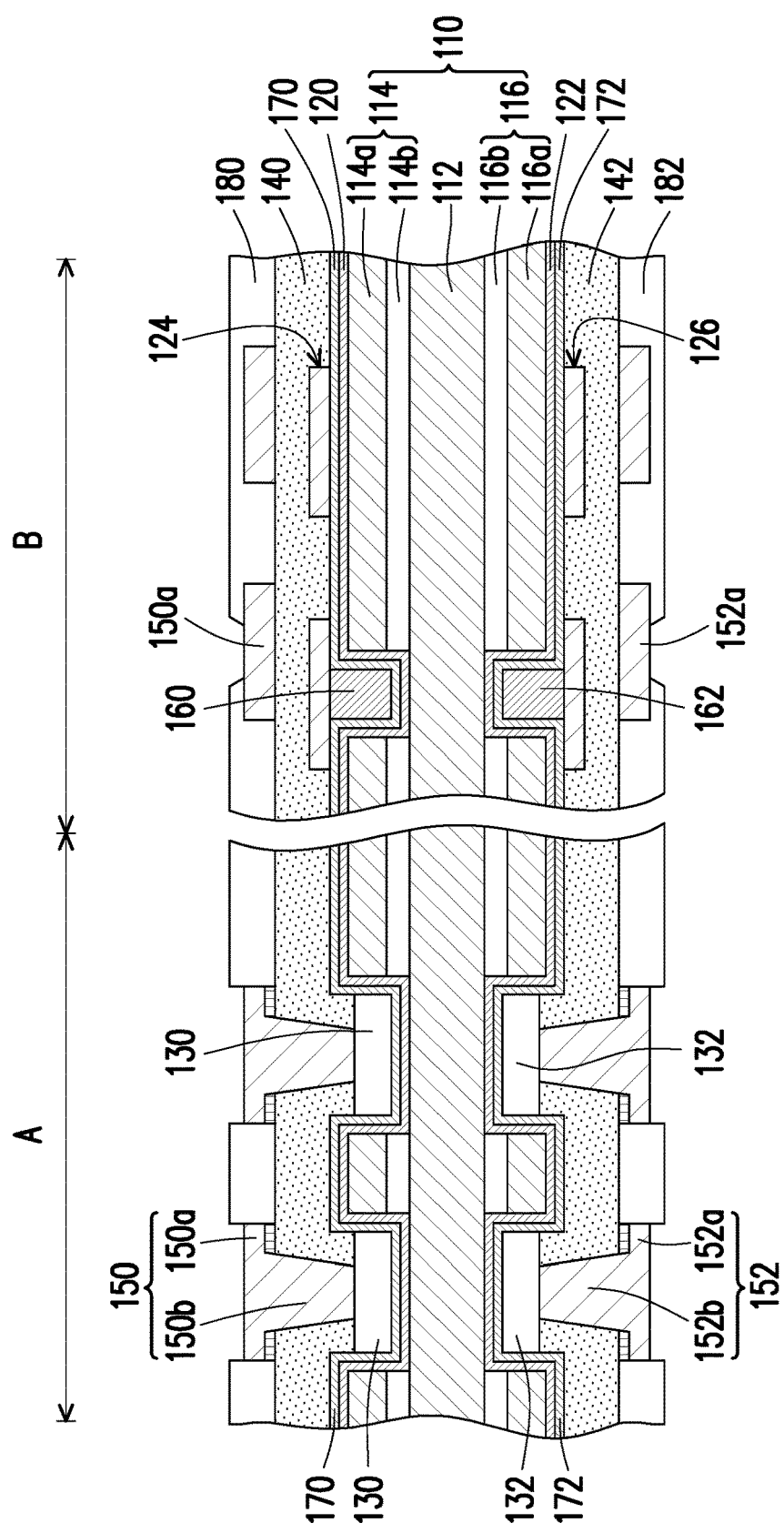

Then, referring to FIG. 1J, after the first circuit structure 150 and the second circuit structure 152 are respectively formed on the first insulating layer 140 and the second insulating layer 142, a first patterned solder mask 180 and a second patterned solder mask 182 are respectively formed on the first insulating layer 140 and the second insulating layer 142. The first patterned solder mask 180 and the second patterned solder mask 182 respectively cover the first insulating layer 140 and the second insulating layer 142 and respectively expose a portion of the first circuit structure 150 and a portion of the second circuit structure 152. In the embodiment, materials of the first patterned solder mask 180 and the second patterned solder mask 182 include a solder resistant paint or other suitable solder resistant materials, for example. In addition, nickel-plated gold or an organic solderability preservative (OSP) is disposed on the metal of the exposed circuit structures.

Figure 1K:
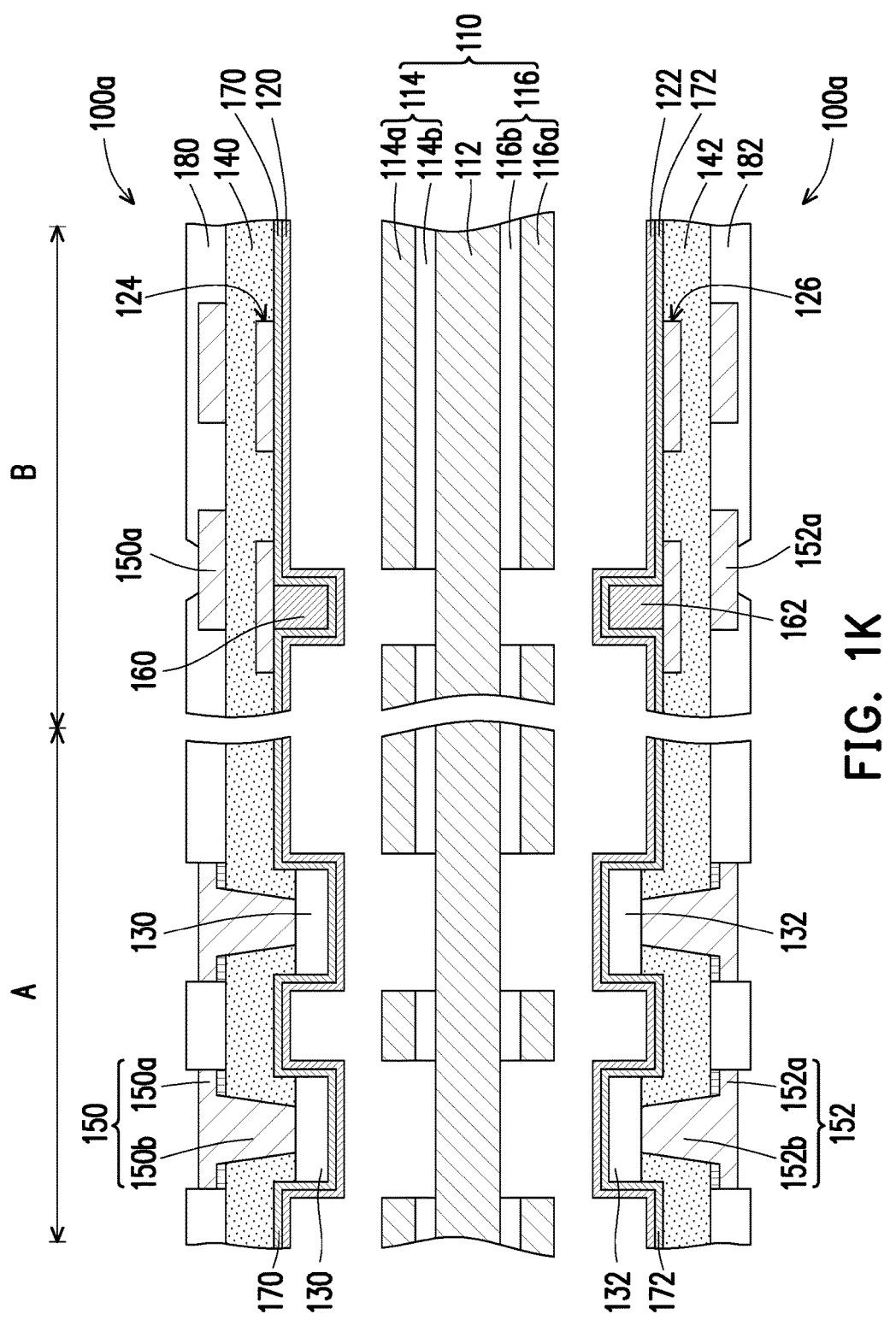
Figure 1L:
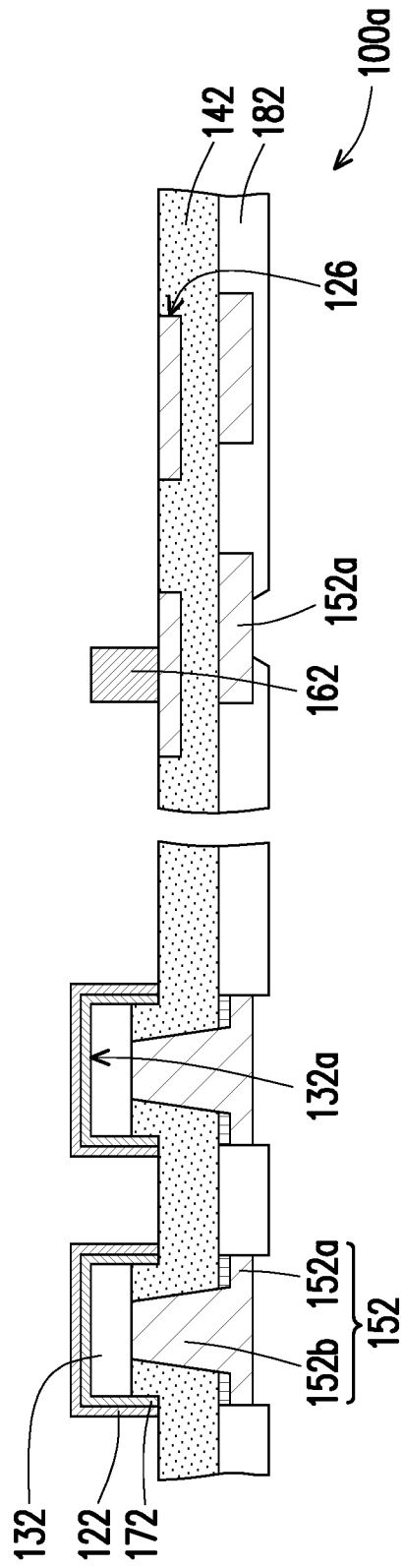

Then, referring to FIG. 1K, the stainless steel base material 110, the first metal layer 120, and the second metal layer 122 are separated to form two separate circuit substrates 100a including electronic devices. In the embodiment, separating the stainless steel base material 110, the first metal layer 120, and the second metal layer 122 includes, for example, cutting along an interface between the first stainless steel layer 114a and the first metal layer 120 and along an interface between the second stainless steel layer 116a and the second metal layer 122 to be separated by about 5.0 millimeters to 10 millimeters by using a cutting tool, performing mechanical processing to separate the stainless steel base material 110, and removing the first metal layer 120 and the first nickel layer 170 on the first insulating layer 140 and the second metal layer 122 and the second nickel layer 172 on the second insulating layer 142 by etching to expose the first circuit pattern 124 and the second circuit pattern 126, as shown in FIG. 1L. In the embodiment, since the size and the structure of the stainless steel base material 110 that is separated are not damaged, the stainless steel base material 110 is reusable. Under the circumstance, the first electronic device 130 and the second electronic device 132 are still covered by the first metal layer 120 and the second metal layer 122, respectively. In addition, the first metal layer 120 and the second metal layer 122 may be considered as metal shielding layers capable of separating interferences of electromagnetic signals on the first electronic devices 130 and the second electronic devices 132. Accordingly, manufacture of the circuit substrate 100a including electronic devices is completed.

In brief, in the manufacturing method of the circuit substrate including an electronic device of the embodiment, the first electronic devices 130 and the second electronic devices 132 are disposed in the first cavities 111 and the second cavities 113 of the stainless steel base material 110. In addition, the stainless steel base material 110 is formed by the stainless steel core layer 112 and the first stainless steel stacking layer 114 and the second stainless steel stacking layer 116 on the opposite two sides of the stainless steel core layer 110 and has a desirable structural stability. In addition, after the first circuit structure 150 and the second circuit structure 152 are formed to be electrically connected with the first electronic devices 130 and the second electronic devices 132, the stainless steel base material 110 is separated, and the two separate circuit substrates 100a including electronic devices are formed. Under the circumstance, the circuit substrate 100a including electronic devices is a coreless circuit substrate including the first electronic devices 130 or the second electronic devices 132. Since the stainless steel base material is reusable, the manufacturing cost may be reduced. In brief, according to the manufacturing method of the circuit board including an electronic device according to the embodiment, two circuit substrates including electronic devices (i.e., the first electronic devices 130 or the second electronic devices 132) are able to be manufactured at the same time. Hence, the manufacturing volume is up and the manufacturing cost is down.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
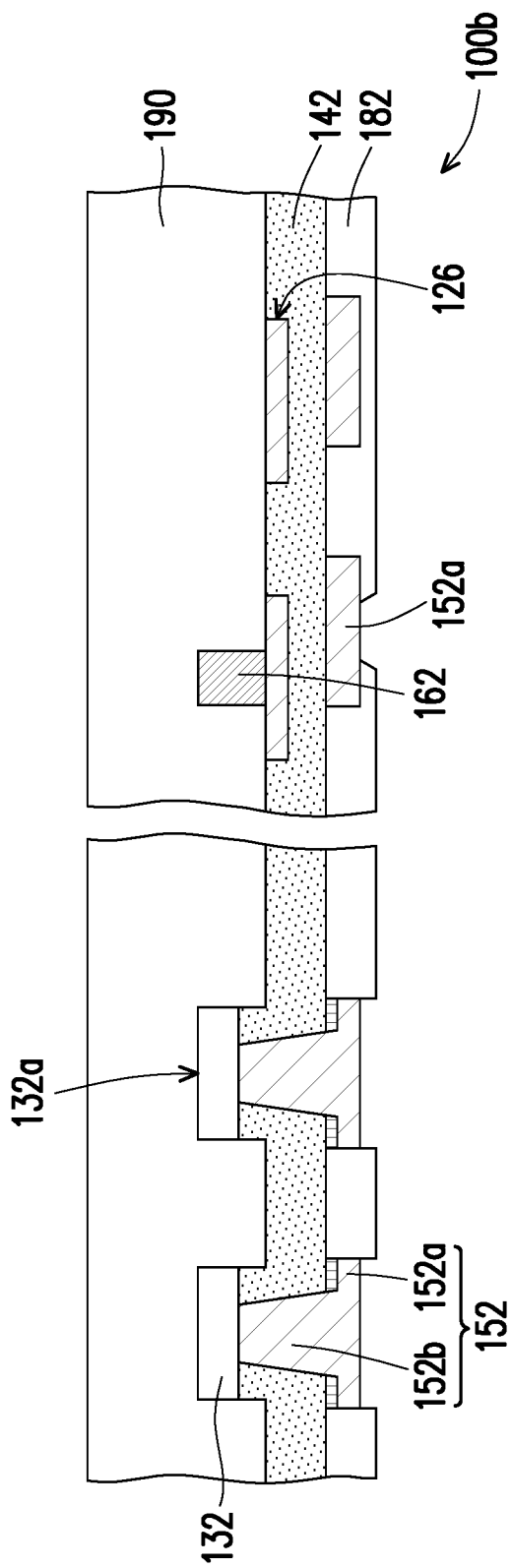
FIG. 2 is a schematic cross-sectional view illustrating a circuit board including an electronic device according to an embodiment of the invention.

FIG. 2 is a schematic cross-sectional view illustrating a circuit substrate including an electronic device according to an embodiment of the invention. For the ease of illustration, FIG. 2 only schematically illustrates a circuit board 100b including the second electronic devices 132. Referring to FIG. 1K and FIG. 2, the circuit 100b including an electronic device of the embodiment is similar to the circuit substrate 100a including an electronic device of FIG. 1K, but a difference therebetween lies in that, after the step of FIG. 1K, i.e., after separating the stainless steel base material 110, the first metal layer 120, and the second metal layer 122, the second metal layer 122 and the second nickel layer 172 covering the second electronic devices 132 and covering the circuit disposing region B are removed. In other words, a portion of the second metal layer 122 and the second nickel layer 172 may be removed to expose light emitting surfaces 132a of the second electronic devices 132, the second insulating layer 142, and the second circuit pattern 126. The second metal layer 122 and the second nickel layer 172 may be removed by etching, for example. Besides, after the portion of the second metal layer 122 and the second nickel layer 172 is removed, a molding compound 190 is formed to at least encapsulate and thus protect the second electronic devices 132. Accordingly, manufacture of the circuit substrate 100b including electronic devices is completed.

Figure 3:
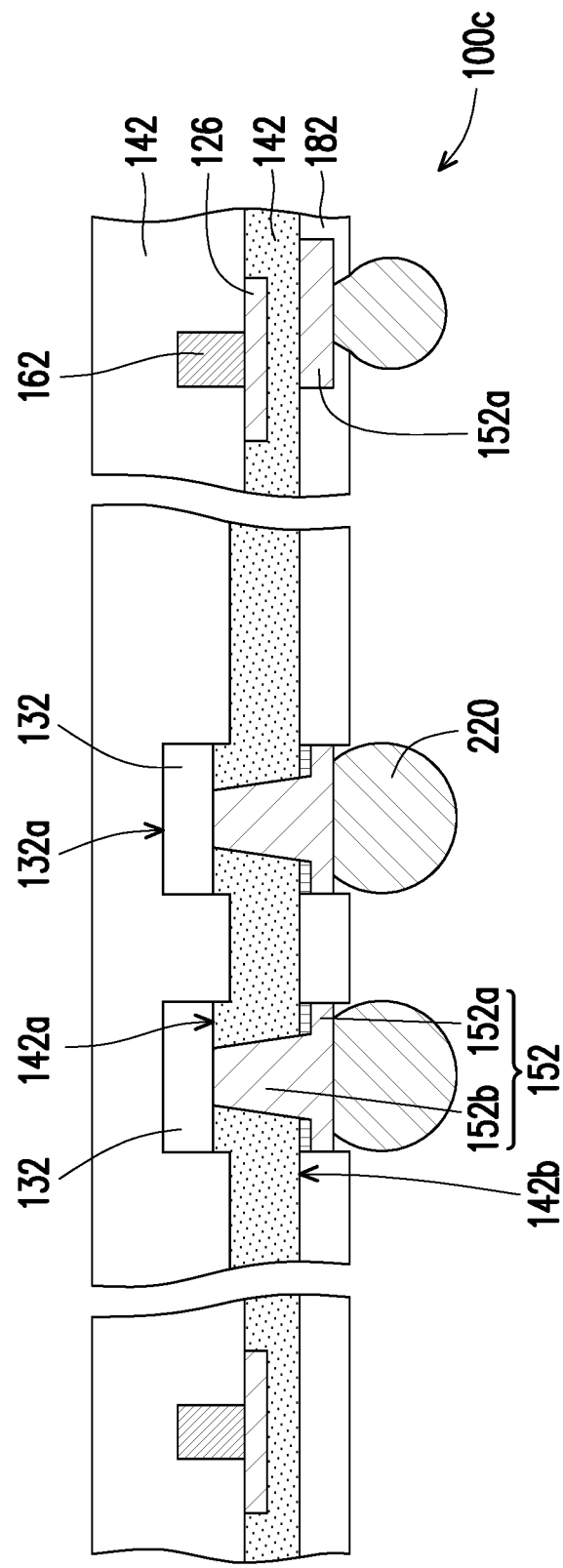
FIG. 3 is a schematic cross-sectional view illustrating a circuit board including an electronic device according to another embodiment of the invention.

FIG. 3 is a schematic cross-sectional view illustrating a circuit substrate including an electronic device according to another embodiment of the invention. Referring to FIGS. 2 and 3, a circuit substrate 100c including an electronic device of the embodiment is similar to the circuit substrate 100b including an electronic device of FIG. 2. After the second metal layer 122 is removed, the second nickel layer 172 is further removed to expose the second bump 162. Then, at least one solder ball 220 (two solder balls 220 shown in FIG. 3 for an illustrative purpose) is formed on the second circuit structure 152. The solder balls 220 directly contact the second patterned circuit layer 152a to serve as a bridge to electrically connect the circuit substrate 100c including an electronic device and an external circuit. Accordingly, manufacture of the circuit substrate 100c including electronic devices is completed.

Figure 4:
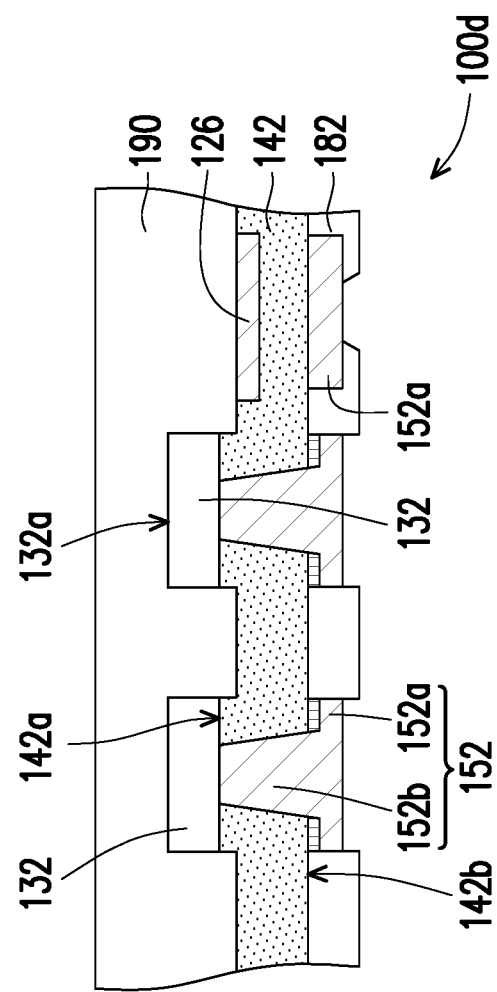
FIG. 4 is a schematic cross-sectional view illustrating a circuit board including an electronic device according to another embodiment of the invention.

FIG. 4 is a schematic cross-sectional view illustrating a circuit substrate including an electronic device according to another embodiment of the invention. Referring to FIGS. 2 and 4, a circuit substrate 100d including an electronic device of the embodiment is similar to the circuit substrate 100b including an electronic device of FIG. 2, but a difference lies in that the circuit substrate 100d including an electronic device of the embodiment only includes the second electronic devices 132 and does not include the second bump 162 of FIG. 2. In other words, manufacture of the bump is optional, and people having ordinary skill in the art may refer to the descriptions of the embodiments and choose the foregoing component based on needs to achieve a technical effect as desired.

Specifically, the circuit substrate 100d including an electronic device of the embodiment includes an insulating layer (i.e., the second insulating layer 142), at least one electronic device (i.e., the two second electronic devices 132), a circuit pattern layer (i.e., the second circuit pattern 126), and a circuit structure (i.e., the second circuit structure 152). The insulating layer (i.e., the second insulating layer 142) has an upper surface 142a and a lower surface 142b opposite to each other. The electronic device (i.e., the two electronic devices 132) is disposed on the upper surface 142a of the insulating layer (i.e., the second insulating layer 142). The circuit pattern layer (i.e., the second circuit pattern 126) is disposed on the upper surface 142a of the insulating layer (i.e., the second insulating layer 142). The circuit structure (i.e., the second circuit structure 152) is disposed on the lower surface 142b of the insulating layer (i.e., the second insulating layer 142), and the circuit structure (i.e., the second circuit structure 152) includes a patterned circuit layer (i.e., the second patterned circuit layer 152a) and at least one conductive blind hole (i.e., the two second conductive blind holes 152b). The conductive blind hole (i.e., the two second conductive blind holes 152b) penetrates the insulating layer (i.e., the second insulating layer 142) to be electrically connected with the electronic device (i.e., the two second electronic devices 132). Moreover, in the embodiment, the circuit substrate 100d including an electronic device further includes a patterned solder mask (i.e., the two second patterned solder masks 182) disposed on the lower surface 142b of the insulating layer (i.e., the second insulating layer 142) and exposing the patterned circuit layer (i.e., the second patterned circuit layer 152a). Besides, the circuit substrate 100d including an electronic device of the embodiment further includes a molding compound 190 disposed on the upper surface 142a of the second insulating layer (i.e., the second insulating layer 142) and at least encapsulates the electronic device (i.e., the two second electronic devices 132).

Figure 5:
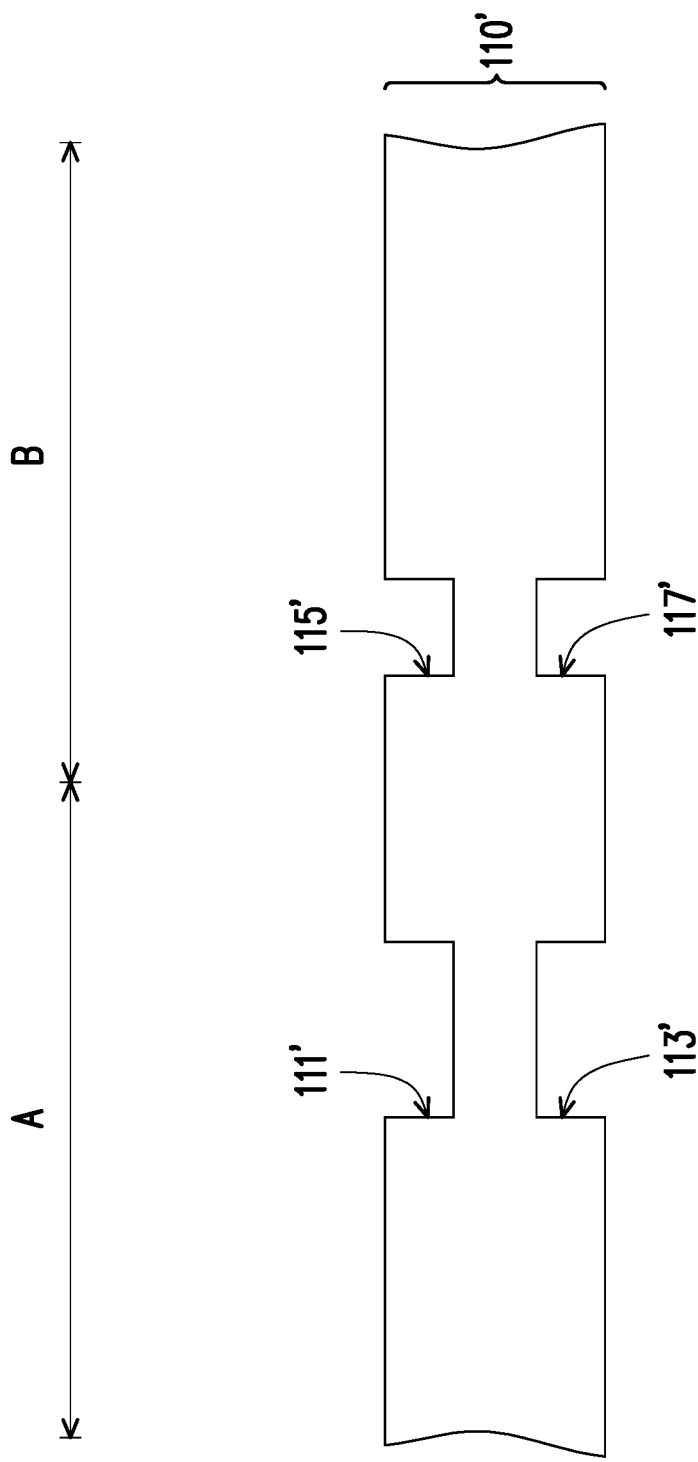
FIG. 5 is a schematic cross-sectional view illustrating a stainless steel base material according to an embodiment of the invention.

FIG. 5 is a schematic cross-sectional view illustrating a stainless steel base material according to an embodiment of the invention. Referring to FIG. 1C and FIG. 5, the stainless steel base material of the embodiment is similar to the stainless steel base material of FIG. 1C, and a difference lies in that a stainless steel base material 110' of the embodiment is integrally formed and does not include the first stainless steel stacking layer 114 and the second stainless steel stacking layer 116 in FIG. 1C. Therefore, a first cavity 111', a second cavity 113', a third cavity 115', and a fourth cavity 117' of the stainless steel base material 110' are formed by removing a portion of the stainless steel base material 110' by electrical discharging machining or by mechanical processing with a precision machine tool, for example. In an embodiment, a thickness of the stainless steel base material 110' is in a range from 0.15 millimeters to 0.5 millimeters, for example. In view of the foregoing, in the manufacturing method of the circuit substrate including an electronic device according to the embodiments of the invention, the electronic devices are disposed in the cavities of the stainless steel base material including the stainless steel core layer and the first stainless steel stacking layer and the second stainless steel stacking layer located at opposite two sides of the stainless steel core layer. Accordingly, the stainless steel base material provides a higher structural stability and interlayer alignment precision for build-up layers. Besides, after the circuit structures are formed to be electrically connected to the electronic devices, the stainless steel base material is separated, and two separate circuit substrates including electronic devices are formed. Under the circumstance, the circuit substrates including electronic devices are coreless circuit substrates including electronic devices. Since the stainless steel base material is reusable, the manufacturing cost may be reduced. In brief, in the manufacturing method of the circuit substrate including an electronic device according to the embodiments of the invention, two circuit substrates including electronic devices are able to be manufactured at the same time. Therefore, the manufacturing volume is up and the manufacturing cost is down.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a circuit substrate comprising an electronic device, the method comprising:
   providing a stainless steel base material, wherein the stainless steel base material has a first surface and a second surface opposite to each other, at least one first cavity located at the first surface, and at least one second cavity located at the second surface;
   respectively forming a first metal layer and a second metal layer on the stainless steel base material, wherein the first metal layer is disposed on the first surface and covers inner walls of the at least one first cavity, and the second metal layer is disposed on the second surface and covers inner walls of the at least one second cavity;
   respectively disposing at least one first electronic device and at least one second electronic device in the at least one first cavity and the at least one second cavity, wherein the first metal layer is located between the at least one first electronic device and the stainless steel base material, and the second metal layer is located between the at least one second electronic device and the stainless steel base material;
   respectively forming a first insulating layer and a second insulating layer on the first surface and the second surface, wherein the first insulating layer covers the at least one first electronic device and the first metal layer, and the second insulating layer covers the at least one second electronic device and the second metal layer;
   respectively forming a first circuit structure and a second structure on the first insulating layer and the second insulating layer, wherein the first circuit structure penetrates the first insulating layer and is electrically connected with the at least one first electronic device, and the second circuit structure penetrates the second insulating layer and is electrically connected with the at least one second electronic device;
   separating the stainless steel base material, the first metal layer, and the second metal layer to form two separate circuit substrates comprising electronic devices; and
   forming a molding compound to at least encapsulate the at least one first electronic device and the at least one second electronic device after separating the stainless steel base material, the first metal layer, and the second metal layer.

2. The manufacturing method as claimed in claim 1, wherein the stainless steel base material comprises a stainless steel core layer, a first stainless steel stacking layer, and a second stainless steel stacking layer, the stainless steel core layer is located between the first stainless steel stacking layer and the second stainless steel stacking layer, the at least one first cavity penetrates the first stainless steel stacking layer and exposes a portion of the first surface of the stainless steel core layer, and the at least one second cavity penetrates the second stainless steel stacking layer and exposes a portion of the second surface of the stainless steel core layer.

3. The manufacturing method as claimed in claim 2, wherein the first stainless steel stacking layer comprises a first stainless steel layer and a first adhesive layer, the second stainless steel stacking layer comprises a second stainless steel layer and a second adhesive layer, the first adhesive layer is located between the first stainless steel layer and the stainless steel core layer, and the second adhesive layer is located between the second stainless steel layer and the stainless steel core layer, wherein providing the stainless steel base material comprises:
   performing a drilling process through the first stainless steel layer and the first adhesive layer and through the second stainless steel layer and the second adhesive layer; and
   after the drilling process, pressing the first stainless steel layer and the first adhesive layer onto the first surface of the stainless steel core layer to form the at least one first cavity and pressing the second stainless steel layer and the second adhesive layer to form the at least one second cavity on the second surface of the stainless steel core layer.

4. The manufacturing method as claimed in claim 3, wherein materials of the first adhesive layer and the second adhesive layer comprise a resin or acrylate.

5. The manufacturing method as claimed in claim 1, wherein the stainless steel base material comprises a device disposing region and a circuit disposing region located on a periphery of the device disposing region, the first metal layer and the second metal layer completely cover the device disposing region and the circuit disposing region.

6. The manufacturing method as claimed in claim 5, wherein the stainless steel base material further comprises at least one third cavity and at least one fourth cavity, the at least one third cavity penetrates the first stainless steel stacking layer and exposes a portion of the first surface of the stainless steel core layer, the at least one fourth cavity penetrates the second stainless steel stacking layer and exposes a portion of the second surface of the stainless steel core layer, the at least one first cavity and the at least one second cavity are located in the device disposing region, and the at least one third cavity and the at least one fourth cavity are located in the circuit disposing region.

7. The manufacturing method as claimed in claim 6, wherein when the first metal layer and the second metal layer are respectively formed on the stainless steel base material, the first metal layer further covers inner walls of the at least one third cavity, and the second metal layer further covers inner walls of the at least one fourth cavity.

8. The manufacturing method as claimed in claim 7, further comprising:
   respectively forming at least one first bump and at least one second bump in the at least one third cavity and the at least one fourth cavity, wherein the first metal layer is located between the at least one first bump and the stainless steel base material, and the second metal layer is located between the at least one second bump and the stainless steel base material.

9. The manufacturing method as claimed in claim 5, wherein materials of the first metal layer and the second metal layer respectively comprise copper, and the manufacturing method further comprises:
   respectively forming a first nickel layer and a second nickel layer on the first metal layer and the second metal layer after respectively forming the first metal layer and the second metal layer on the stainless steel base material; and
   respectively forming a first circuit pattern and a second circuit pattern on the first nickel layer and the second nickel layer, wherein the first circuit pattern covers the first nickel layer, and the second circuit pattern covers the second nickel layer.

10. The manufacturing method as claimed in claim 8, wherein after separating the stainless steel base material, the first metal layer, and the second metal layer, the method further comprises:

removing the first metal layer, the first nickel layer, the second metal layer, and the second nickel layer by etching to expose the first circuit pattern and the second circuit pattern.

11. The manufacturing method as claimed in claim 5, wherein materials of the first metal layer and the second metal layer respectively comprise nickel, and the manufacturing method further comprises:

respectively forming a first circuit pattern and a second circuit pattern on the first metal layer and the second metal layer, wherein the first circuit pattern covers the first metal layer, and the second circuit pattern covers the second metal layer.

12. The manufacturing method as claimed in claim 11, wherein after separating the stainless steel base material, the first metal layer, and the second metal layer, the method further comprises:

removing the first metal layer and the second metal layer by etching to expose the first circuit pattern and the second circuit pattern.

13. The manufacturing method as claimed in claim 1, wherein a depth of the at least one first cavity is greater than a height of the at least one first electronic device, and a depth of the at least one second cavity is greater than a height of the at least one second electronic device.

14. The manufacturing method as claimed in claim 1, wherein the first circuit structure comprises a first patterned circuit layer and at least one first conductive blind hole, the second circuit structure comprises a second patterned circuit layer and at least one second conductive blind hole, the at least one first conductive blind hole is located between the at least one first electronic device and the first patterned circuit layer, the at least one second conductive blind hole is located between the at least one second electronic device and the second patterned circuit layer, and the first patterned circuit layer and the second patterned circuit layer are respectively located on the first insulating layer and the second insulating layer.

15. The manufacturing method as claimed in claim 1, wherein after respectively forming the first circuit structure and the second circuit structure on the first insulating layer and the second insulating layer, and before separating the stainless steel base material, the first metal layer, and the second metal layer, the method further comprises:

respectively forming a first patterned solder mask and a second patterned solder mask on the first insulating layer and the second insulating layer, wherein the first patterned solder mask and the second patterned solder mask respectively cover the first insulating layer and the second insulating layer and respectively expose a portion of the first circuit structure and a portion of the second circuit structure.

16. The manufacturing method as claimed in claim 1, wherein the first circuit structure comprises at least one first insulating layer, a first solder resistant layer, at least one first patterned circuit layer, and at least one first conductive blind hole, the second circuit structure comprises at least one second insulating layer, a second solder resistant layer, at least one second patterned circuit layer, and at least one second conductive blind hole, the at least one first insulating layer and the first solder resistant layer cover the first patterned circuit layer, the at least one second insulating layer and the second solder resistant layer cover the at least one second patterned circuit layer, the at least one first conductive blind hole and the at least one second conductive blind hole respectively penetrate the first insulating layer and the second insulating layer.

17. The manufacturing method as claimed in claim 1, wherein a material of the stainless steel base material is selected from SUS 304, SUS 430, SUS 630, an iron-nickel alloy, and a Kovar alloy.

18. The manufacturing method as claimed in claim 1, wherein the at least one first cavity and the at least one second cavity of the stainless steel base material are formed by removing a portion of the stainless steel base material by electrical discharging machining or mechanical processing.

* * * * *